United States Patent
Hsieh

(10) Patent No.: US 10,787,366 B2
(45) Date of Patent: Sep. 29, 2020

(54) METHOD FOR MANUFACTURING GRAPHITIC SHEET

(71) Applicant: NATIONAL SUN YAT-SEN UNIVERSITY, Kaohsiung (TW)

(72) Inventor: Shu-Chen Hsieh, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 287 days.

(21) Appl. No.: 16/120,494

(22) Filed: Sep. 4, 2018

(65) Prior Publication Data

US 2020/0039829 A1   Feb. 6, 2020

(30) Foreign Application Priority Data

Jul. 31, 2018   (TW) .............................. 107126560 A

(51) Int. Cl.
| | |
|---|---|
| *C01B 32/205* | (2017.01) |
| *C04B 35/52* | (2006.01) |
| *C04B 35/528* | (2006.01) |
| *C09D 201/10* | (2006.01) |
| *B82Y 40/00* | (2011.01) |
| *B82Y 30/00* | (2011.01) |
| *G03F 7/16* | (2006.01) |

(52) U.S. Cl.
CPC .......... *C01B 32/205* (2017.08); *C04B 35/522* (2013.01); *C04B 35/528* (2013.01); *C09D 201/10* (2013.01); *B81C 2201/0149* (2013.01); *B82Y 30/00* (2013.01); *B82Y 40/00* (2013.01); *C01P 2002/82* (2013.01); *C04B 35/52* (2013.01); *G03F 7/165* (2013.01); *Y10T 428/2995* (2015.01)

(58) Field of Classification Search
CPC ... C01B 32/205; C04B 35/528; C04B 35/522; C04B 35/52; C09D 201/10; B82Y 30/00; B82Y 40/00; Y10T 428/31663; Y10T 428/2995; B05D 1/185; G03F 7/165; B81C 2201/0149
See application file for complete search history.

(56) References Cited

U.S. PATENT DOCUMENTS 9,941,380 B2 *   4/2018   Liu .................... H01L 29/778

FOREIGN PATENT DOCUMENTS

CN          103073048 A   *   5/2013

OTHER PUBLICATIONS

Cheng, Yue-an, et al. "Solvent effects on molecular packing and tribological properties of octadecyltrichlorosilane films on silicon." Langmuir 26.11 (Jan. 28, 2010): 8256-8261. (Year: 2010).*
Machine translation CN 103073048 A, May 2013 (Year: 2013).*
Sagawa, Natsuko, and Takashi Uchino. "Effect of annealing on the visible photoluminescence characteristics of octadecyltrichlorosilane monolayers on silica surfaces." The Journal of Physical Chemistry C 112.12 (Mar. 4, 2008): 4581-4589. (Year: 2008).*
Yang, Xiang Dong, et al. "Thermal Stability of Octadecyltrichlorosilane and Perfluorooctyltriethoxysilane Monolayers on SiO2." Nanomaterials 10.2 (Jan. 26, 2020): 210. (Year: 2020).*
mrclab.com, DC-200H_SPEC.pdg, Retrieved: Aug. 12, 2020, https://www.mrclab.com/Media/Uploads/DC-200H_SPEC.pdf (Year: 2020).*
Saner, ChaMarra K., et al. "Self-assembly of octadecyltrichlorosilane: Surface structures formed using different protocols of particle lithography." Beilstein Journal of Nanotechnology 3.1 (Feb. 9, 2012): 114-122. (Year: 2012).*
Pei-Ying Lin et al., "Rapid and Sensitive SERS Detection of Bisphenol A Using Selfassembled Graphitic Substrates" (Grace period inventor originated disclosure), Published online: Dec. 1, 2017, Scientific Reports.

* cited by examiner

*Primary Examiner* — Benjamin A Schiffman
(74) *Attorney, Agent, or Firm* — WPAT, PC

(57) ABSTRACT

A method for manufacturing a graphitic sheet is used to obtain the graphitic sheet with similar characteristics to graphene. The method includes forming an octadecyltrichlorosilane (OTS) layer on a substrate to obtain a composite. The composite is annealed at 250-400° C. for 30-90 minutes, forming the graphitic sheet on the substrate via self-assembly of octadecyltrichlorosilane (OTS) in the OTS layer. The annealed composite is immersed in water, followed by being sonicated for 2 minutes with a frequency of 40 kHz and a power output of 200 W, to separate the graphitic sheet from the substrate.

6 Claims, 2 Drawing Sheets

METHOD FOR MANUFACTURING GRAPHITIC SHEET

CROSS REFERENCE TO RELATED APPLICATIONS

The application claims the benefit of Taiwan application serial No. 107126560, filed Jul. 31, 2018, the entire contents of which are incorporated herein by reference.

BACKGROUND OF THE INVENTION

1. Field of the Invention

The present invention generally relates to a method for manufacturing a graphitic sheet and, more particularly, to a method for manufacturing the graphitic sheet with similar characteristics to graphene.

2. Description of the Related Art

Graphene is a sheet with honeycomb crystal lattice, and a two dimensional material consisting of a single layer of carbon atoms, having a thickness of about 0.34 nm. Graphene has excellent properties such as mechanical strength, thermal conduction and carrier transport rate; and therefore can be applied to various fields.

However, graphene is usually manufactured by a conventional chemical vapor deposition (CVD), which is a complex procedure for manufacturing graphene. In light of this, it is necessary to provide a graphitic sheet with similar characteristics to graphene, which is manufactured by a simpler procedure.

SUMMARY OF THE INVENTION

It is therefore an objective of the present invention to provide a method for manufacturing a graphitic sheet with similar characteristics to graphene.

One embodiment of the present invention discloses a method for manufacturing a graphitic sheet. The method includes forming an octadecyltrichlorosilane (OTS) layer on a substrate to obtain a composite. The composite is annealed at 250-400° C. for 30-90 minutes, forming the graphitic sheet on the substrate via self-assembly of octadecyltrichlorosilane (OTS) in the OTS layer. The annealed composite is immersed in water, followed by being sonicated for 2 minutes with a frequency of 40 kHz and a power output of 200 W, to separate the graphitic sheet from the substrate. Accordingly, the graphitic sheet with a lattice spacing of approximately 0.24 nm, and with a thickness of approximately 0.34 nm can be manufactured, That is, the manufactured graphitic sheet has similar characteristics to graphene. Therefore, the graphitic sheet can be used as a substitute of graphene. As an example, the graphitic sheet can be used as a surface-enhanced Raman spectroscopy (SERS) substrate for analyzing a concentration of bisphenol A (BPA) in a sample.

In an example, forming the OTS layer on the substrate includes immersing the substrate in a octadecyltrichlorosilane (OTS) solution, followed by sitting for 24 hours at 25-35° C. to obtain a semi-product of the composite. The semi-product of the composite is annealed at 115° C. for 10 minutes. As such, the OTS layer with equal thickness can be formed on the substrate.

In an example, the method further includes: forming the OTS solution by dissolving OTS in a solvent. The solvent is hexadecane, tolune, chloroform or dichloromethane. As such, by the use of the specific solvent, OTS can be uniformly distributed in the OTS solution.

In an example, the method further includes: before annealing the semi-product of the composite, rinsing the semi-product of the composite using at least one rinsing solution to remove impurities on the semi-product of the composite. Preferably, rinsing the semi-product of the composite using the at least one rinsing solution includes: rinsing the semi-product of the composite sequentially using a first rinsing solution, a second rinsing solution and a third rinsing solution. The first rinsing solution, the second rinsing solution and the third rinsing solution is chloroform, isopropanol and deionized water, respectively. As such, by the use of the first rinsing solution, the second rinsing solution and the third rinsing solution, the impurities on the semi-product of the composite can be removed.

In an example, the substrate is a silicon substrate. As such, by the flat surface of the silicon substrate, OTS in the OTS layer can form Si—O bond. Therefore, the silicon substrate can be a great substrate for supporting the formed graphitic sheet.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

Figure 1:
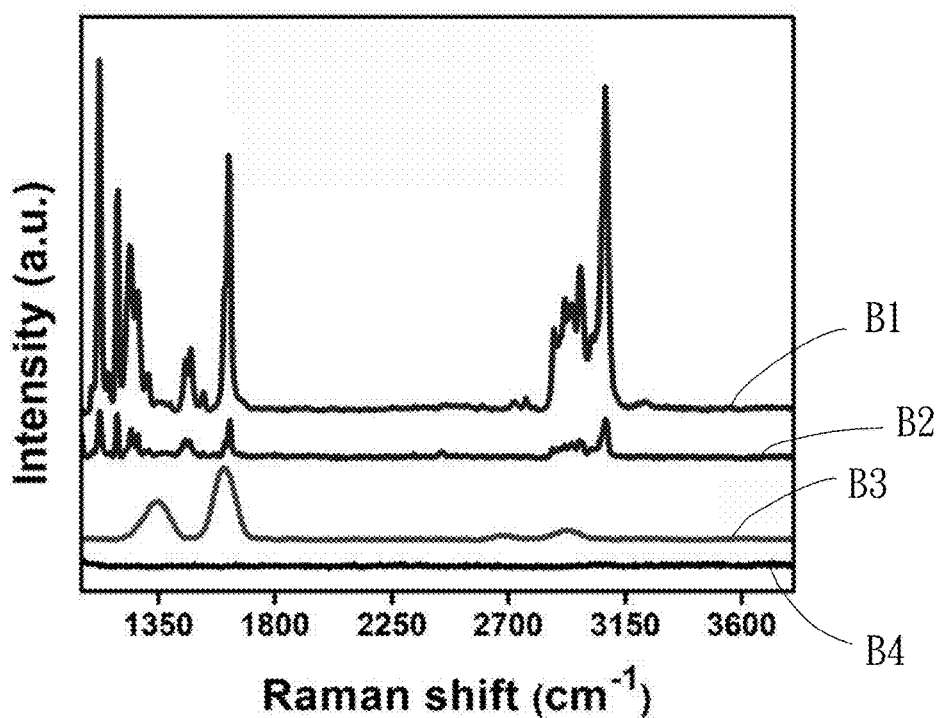
FIG. 1 depicts Raman spectra of groups B1-B4 in trial (B).

In the various figures of the drawings, the same numerals designate the same or similar parts. Furthermore, when the term "first", "second" "third" and similar terms are used hereinafter, it should be understood that these terms refer only to the structure shown in the drawings as it would appear to a person viewing the drawings, and are utilized only to facilitate describing the invention.

DETAILED DESCRIPTION OF THE INVENTION

According to a method for manufacturing a graphitic sheet of the present invention, the graphitic sheet is formed on a substrate by self-assembly of a octadecyltrichlorosilane (OTS) layer on the substrate. A lattice spacing of the graphitic sheet is approximately 0.24 nm, and a thickness of the graphitic sheet is approximately 0.34 nm. That is, the graphitic sheet has similar characteristics to graphene.

Specifically, a worker can form the OTS layer on the substrate by any conventional way such as coating and spraying. In this embodiment, a silicon substrate used as the substrate is immersed in an octadecyltrichlorosilane (OTS) solution (1 M), followed by sitting at 25-35° C. for 24 hours to obtain a semi-product of the composite. Then, the semi-product of the composite is annealed at 115° C. for 10 minutes to obtain a composite. The composite includes the substrate and the OTS layer formed on the substrate. Moreover, the OTS solution includes octadecyltrichlorosilane (OTS) and a solvent. The solvent can be hexadecane, tolune, chloroform or dichloromethane. Thus, OTS can be uniformly distributed in the OTS solution.

In addition, to remove impurities adhered on the semi-product of the composite, before annealing the semi-product of the composite, the semi-product of the composite can be rinsed using at least one rinsing solution. In this embodiment, the semi-product of the composite is sequentially rinsed using a first rinsing solution, a second rinsing solution and third rinsing solution. The first rinsing solution, the second rinsing solution and the third rinsing solution is chloroform, isopropanol and deionized water, respectively.

Then, the composite is annealed at a high temperature, assuring self-assembly of OTS in the OTS layer. In this embodiment, the composite is annealed at 250-400° C. for 30-90 minutes. At this time, OTS in the OTS layer self-assembles to form the graphitic sheet on the substrate.

Furthermore, the worker can separate the graphitic sheet from the substrate. In this embodiment, the annealed composite is immersed in water, followed by sonication for 2 minutes with a frequency of 40 kHz and a power output of 200 W. As a result, the graphitic sheet is separated from the substrate.

To evaluate the graphitic sheet manufactured according to the method for manufacturing the graphitic sheet has characteristics similar to graphene, and can be used as surface-enhanced Raman spectroscopy (SERS) substrate for analyzing the concentration of bisphenol A (BPA) in a sample, the following trials are carried out.

Trial (A).

According to transmission electron microscopy (TEM) and high-resolution transmission electron microscopy (HR-TEM) images, the manufactured graphitic sheet has a lattice spacing of 0.24 nm, which is comparable to the lattice constant of graphene. Moreover, according to the topographic atomic force microscopy (AFM) image, a thickness of the graphitic sheet is approximately 0.34 nm, which is comparable to the interlayer spacing of graphene. That is, the graphitic sheet has similar characteristics to graphene.

Trial (B).

A BPA solution (0.1 M) obtained by dissolving BPA in ethanol (95% ethanol$_{(aq)}$) is used as the sample in trial (B). 2 μL of the BPA solution is deposited on the graphitic sheet of group B1, as well as the silicon substrate of group B2, followed by drying at room temperature. Raman experiment is performed on a Raman microscope with a 532 nm incident laser at 21.9 mW powers. The graphitic sheet and the silicone substrate without deposition of the BPA solution are used as groups B3 and B4, respectively.

Referring to FIG. 1, Raman spectra from the graphitic sheet (group B3) only shows peaks at 1341 cm$^{-1}$ and 1602 cm$^{-1}$. Raman spectrum from the BPA-deposited graphitic sheet (group B1), as well as from the BPA-deposited silicon substrate (group B2), show peaks at 1121 cm$^{-1}$, 1188 cm$^{-1}$, 1240 cm$^{-1}$, 1269 cm$^{-1}$, 1621 cm$^{-1}$ and 3072 cm$^{-1}$. The BPA signal is detected on both the graphitic sheet (group B1) and the silicon substrate (group B2). However, the graphitic sheet of group B1 exhibits a stronger SERS enhancement compared to the silicon substrate of group B2, indicating that the graphitic sheet can be used as the SERS substrate.

Trial (C).

The BPA solutions with concentrations of 10$^{-1}$ M (group C1), 10$^{-2}$ M (group C2), 10$^{-3}$ M (group C3), 10$^{-4}$ M (group C4), 10$^{-5}$ M (group C5) and 10$^{-6}$ M (group C6) are used as the samples in trial (C). The samples are deposited on the graphitic sheet, followed by the Raman experiments.

Figure 2:
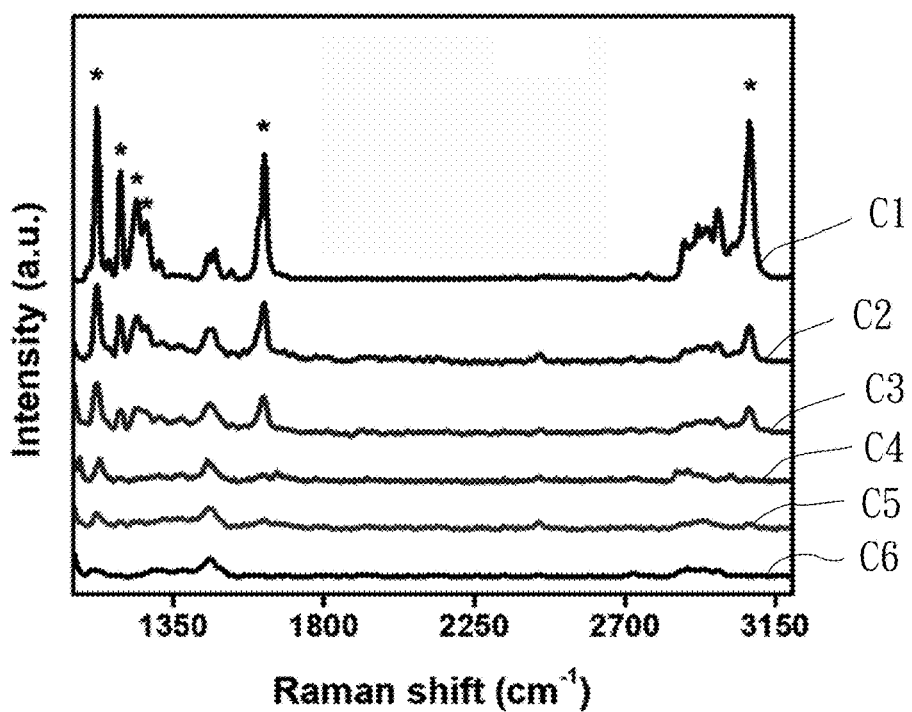
FIG. 2 depicts Raman spectra of groups C1-C4 in trial (C).

Referring to FIG. 2, by the use of the graphitic sheet, the BPA signal can be detected even though the concentration of the BPA solution is merely 10$^{-6}$ M (group C6). Moreover, the concentration (10$^{-6}$ M) is lower than the European Union migration limit of BPA in food of 0.6 mg/kg (2.6 μM).

Trial (D).

Plastic spoons (two types, groups D1 and D2), baby bottles (group D3), re-sealable zipper storage bags (group D4) and airtight food container are used as the samples in trial (D). The samples are in contact with hot water (80° C.) for 1 hour, deposited on the graphitic sheet, followed by the Raman experiments. The BPA solution with the concentration of 10$^{-4}$ M is used as the sample of group D6.

Figure 3:
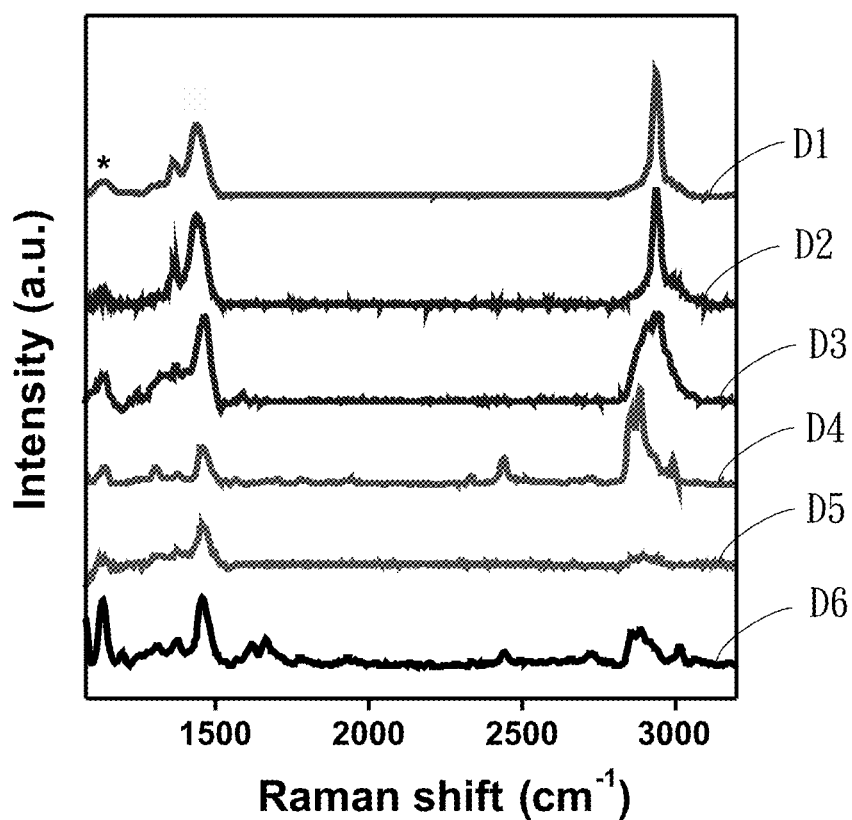
FIG. 3 depicts Raman spectra of groups D1-D6 in trial (D).

Referring to FIG. 3, according to the peak area of the peak near 1121 cm$^{-1}$ (shown in the symbol * in FIG. 3), the migration levels of BPA from the samples of groups D1-D6 are approximately 1×10$^{-5}$ M, 3.2×10$^{-6}$ M, 2×10$^{-5}$ M, 1×10$^{-6}$M and 6.3×10$^{-7}$ M, respectively.

Trial (E).

The BPA solutions (10$^{-3}$ M) with concentrations of sodium chloride (NaCl) of 0 M (group E1), 0.025 M (group E2), 0.05 M (group E3), 0.1 M (group E4), 0.25 M (group E5), 0.5 M (group E6), 1 M (group E7) and 2 M (group E8), respectively, are used as the samples in trial (E). The samples are deposited on the graphitic sheet, followed by the Raman experiments.

Figure 4:
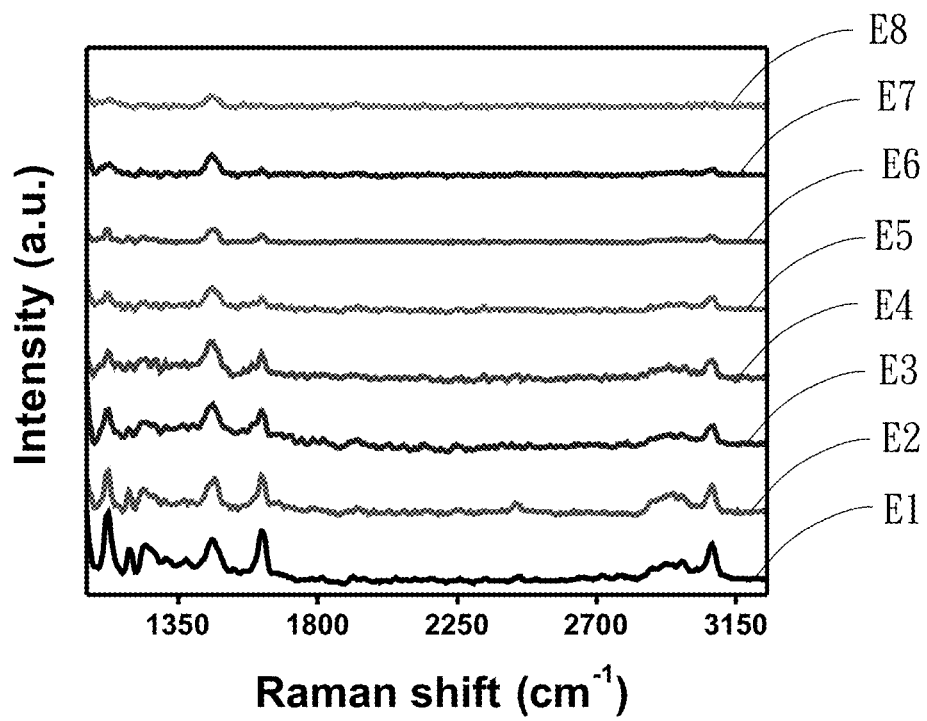
FIG. 4 depicts Raman spectra of groups E1-E8 in trial (E).

Referring to FIG. 4, the BPA signal decreases as the concentration of NaCl increases. However, under the NaCl ionic strength similar to human serum with the NaCl ionic strength of 0.14 M, as well as to human urine with the NaCl ionic strength of 0.17 M, the BPA signal can still be strongly detected, indicating that the graphitic sheet can be applied to not only detect BPA in the salt solution, but also to detect BPA in body fluids such as serum or urine.

Accordingly, the graphitic sheet manufactured by the method according to the present invention has a lattice spacing of about 0.24 nm, and a thickness of about 0.34 nm, That is, the graphitic sheet has similar characteristics to graphene. Therefore, the graphitic sheet can be used as the SERS substrate, instead of graphene, and be applied to analyze the concentration of BPA in the sample.

Although the invention has been described in detail with reference to its presently preferable embodiment, it will be understood by one of ordinary skill in the art that various modifications can be made without departing from the spirit and the scope of the invention, as set forth in the appended claims.

What is claimed is:

1. A method for manufacturing a graphitic sheet, comprising:
    forming an octadecyltrichlorosilane (OTS) layer on a substrate to obtain a composite;
    annealing the composite at 250-400° C. for 30-90 minutes, forming the graphitic sheet on the substrate via self-assembly of octadecyltrichlorosilane (OTS) in the OTS layer; and
    immersing the annealed composite in water, followed by being sonicated for 2 minutes with a frequency of 40 kHz and a power output of 200 W, to separate the graphitic sheet from the substrate.

2. The method for manufacturing the graphitic sheet as claimed in claim 1, wherein forming the OTS layer on the substrate comprises:
    immersing the substrate in a octadecyltrichlorosilane (OTS) solution, followed by sitting for 24 hours at 25-35° C. to obtain a semi-product of the composite; and
    annealing the semi-product of the composite at 115° C. for 10 minutes.

3. The method for manufacturing the graphitic sheet as claimed in claim 2, further comprising: forming the OTS solution by dissolving OTS in a solvent, wherein the solvent is hexadecane, tolune, chloroform or dichloromethane.

4. The method for manufacturing the graphitic sheet as claimed in claim 2, further comprising: before annealing the semi-product of the composite, rinsing the semi-product of the composite using at least one rinsing solution to remove impurities on the semi-product of the composite.

5. The method for manufacturing the graphitic sheet as claimed in claim 4, wherein rinsing the semi-product of the composite using the at least one rinsing solution comprises rinsing the semi-product of the composite sequentially using a first rinsing solution, a second rinsing solution and a third rinsing solution, wherein the first rinsing solution, the second rinsing solution and the third rinsing solution is chloroform, isopropanol and deionized water, respectively.

6. The method for manufacturing the graphitic sheet as claimed in claim 1, wherein the substrate is a silicon substrate.

* * * * *